(12) United States Patent
    Yanagi et al.

(10) Patent No.: US 12,644,015 B2
(45) Date of Patent: Jun. 2, 2026

(54) METHOD FOR MANUFACTURING ABRASIVE GRAINS, COMPOSITION FOR CHEMICAL MECHANICAL POLISHING, AND METHOD FOR CHEMICAL MECHANICAL POLISHING

(71) Applicant: JSR CORPORATION, Tokyo (JP)

(72) Inventors: Takanori Yanagi, Tokyo (JP); Pengyu Wang, Tokyo (JP); Kouji Nakanishi, Tokyo (JP); Yuuya Yamada, Tokyo (JP); Atsushi Baba, Tokyo (JP)

(73) Assignee: JSR CORPORATION, Tokyo (JP)

( * ) Notice: Subject to any disclaimer, the term of this patent is extended or adjusted under 35 U.S.C. 154(b) by 531 days.

(21) Appl. No.: 17/928,279

(22) PCT Filed: May 25, 2021

(86) PCT No.: PCT/JP2021/019779
    § 371 (c)(1),
    (2) Date: Nov. 29, 2022

(87) PCT Pub. No.: WO2022/004197
    PCT Pub. Date: Jan. 6, 2022

(65) Prior Publication Data
    US 2023/0220240 A1    Jul. 13, 2023

(30) Foreign Application Priority Data
    Jun. 30, 2020    (JP) ................................. 2020-112664

(51) Int. Cl.
    *C09G 1/02*      (2006.01)
    *C09K 3/14*      (2006.01)
    *H10P 52/40*     (2026.01)

(52) U.S. Cl.
    CPC .............. *C09G 1/02* (2013.01); *C09K 3/1409* (2013.01); *H10P 52/402* (2026.01)

(58) Field of Classification Search
    None
    See application file for complete search history.

(56) References Cited

U.S. PATENT DOCUMENTS

| | | | | |
|---|---|---|---|---|
| 2008/0254717 A1* | 10/2008 | Fukasawa | ................ | C09G 1/02 |
| | | | | 451/36 |
| 2010/0181525 A1* | 7/2010 | Belmont | .............. | C09K 3/1436 |
| | | | | 252/79.1 |
| 2016/0090513 A1* | 3/2016 | Zhang | .................. | C09K 3/1409 |
| | | | | 252/79.1 |

FOREIGN PATENT DOCUMENTS

| | | |
|---|---|---|
| JP | 2004214667 | 7/2004 |
| JP | 2006120728 | 5/2006 |

(Continued)

OTHER PUBLICATIONS

"International Search Report (Form PCT/ISA/210) of PCT/JP2021/019779," mailed on Jun. 29, 2021, with English translation thereof, pp. 1-4.

(Continued)

*Primary Examiner* — Stephanie P Duclair
(74) *Attorney, Agent, or Firm* — JCIPRNET

(57) ABSTRACT

Provided are abrasive grains and a composition for chemical mechanical polishing which are for selectively polishing a silicon nitride film, and which are applicable not only to silicon oxide films but also to amorphous silicon films and polysilicon films. This method for manufacturing abrasive grains includes: a first step of heating a mixture which contains particles having a sulfanyl group (—SH) fixed to the surface thereof via covalent bonds, and which contains a compound having carbon-carbon unsaturated double bonds; and a second step, which is performed after the first step, of further adding a peroxide and carrying out heating.

5 Claims, 3 Drawing Sheets

(56) References Cited

FOREIGN PATENT DOCUMENTS

| | | | |
|----|----------------|---|---------|
| JP | 2018067696 | | 4/2018 |
| JP | 2018107294 | | 7/2018 |
| JP | 2018107294 A | * | 7/2018 |
| KR | 20120134105 | | 12/2012 |
| KR | 20130025870 | | 3/2013 |

OTHER PUBLICATIONS

"Office Action of Taiwan Counterpart Application" with English translation thereof, issued on Nov. 25, 2021, p. 1- p. 7.
"Request for the Submission of an Opinion of Korea Counterpart Application", issued on Feb. 21, 2025, with English translation thereof, pp. 1-22.

* cited by examiner

METHOD FOR MANUFACTURING ABRASIVE GRAINS, COMPOSITION FOR CHEMICAL MECHANICAL POLISHING, AND METHOD FOR CHEMICAL MECHANICAL POLISHING

CROSS-REFERENCE TO RELATED APPLICATION

This application is a 371 application of an international PCT application serial no. PCT/JP2021/019779, filed on May 25, 2021, which claims the priority benefit of Japan application JP2020-112664, filed on Jun. 30, 2020. The entirety of the above-mentioned patent application is hereby incorporated by reference herein and made a part of this specification.

TECHNICAL FIELD

The present invention relates to a method for manufacturing abrasive grains, a composition for chemical mechanical polishing, and a method for chemical mechanical polishing.

BACKGROUND ART

Refinement of wiring layers consisting of wiring, plugs, and the like formed in semiconductor devices is progressing. Along with this, an approach of flattening by subjecting wiring layers to chemical mechanical polishing (hereinafter also referred to as "CMP") is used. Generally, in CMP for polishing a silicon oxide film ($SiO_2$), by taking advantage of the condition in which a silicon nitride film (SiN) is a film that is unlikely to be polished, the end point is detected by using the silicon nitride film as a stopper film. After removing a silicon oxide film by CMP, it is also required to remove the silicon nitride film as a stopper film.

In order to selectively remove the silicon nitride film by CMP, it is required to increase a ratio of the polishing rate (hereinafter also referred to as "selectivity") of the silicon nitride film to that of the silicon oxide film or a polysilicon film. In order to realize such characteristics, a method of polishing a silicon nitride film using a polishing liquid which contains phosphoric acid, nitric acid, and hydrofluoric acid and in which a pH has been adjusted to 1 to 5; a polishing liquid which contains an acidic additive with a reduced etching action and is capable of selectively polishing a silicon nitride film; and the like have been proposed (refer to Patent Literature 1 and Patent Literature 2).

CITATION LIST

Patent Literature

[Patent Literature 1]
    Japanese Patent Laid-Open No. 2004-214667
[Patent Literature 2]
    Japanese Patent Laid-Open No. 2006-120728

SUMMARY OF INVENTION

Technical Problem

However, although the polishing liquids disclosed in Patent Literature 1 and Patent Literature 2 can selectively polish a silicon nitride film with respect to silicon oxide films, it is not clear whether these polishing liquids can also selectively polish a silicon nitride film with respect to amorphous silicon films or polysilicon films. When a silicon nitride film can be selectively polished with respect to not only silicon oxide films but also amorphous silicon films and polysilicon films, any of silicon oxide films, amorphous silicon films, and polysilicon films can be utilized as a stopper film in CMP for polishing a silicon nitride film, which greatly improves convenience.

As above, abrasive grains and a composition for chemical mechanical polishing which are for selectively polishing a silicon nitride film with respect to not only silicon oxide films but also amorphous silicon films and polysilicon films are required.

Solution to Problem

One aspect of a method for manufacturing abrasive grains according to the present invention includes:
    a first step of heating a mixture which contains particles having a sulfanyl group (—SH) fixed to a surface thereof via a covalent bond, and which contains a compound having a carbon-carbon unsaturated double bond; and
    a second step of further adding a peroxide and carrying out heating after the above-mentioned first step.
    In one aspect of the method for manufacturing abrasive grains,
        the above-mentioned mixture in the above-mentioned first step may further contain a radical-generating agent.
    In any of the aspects of the method for manufacturing abrasive grains,
        an average molecular weight of the above-mentioned compound having a carbon-carbon unsaturated double bond may be 100 to 10,000.
    In any of the aspects of the method for manufacturing abrasive grains,
        the above-mentioned abrasive grains may have a functional group represented by General Formula (1) on a surface thereof.

$$—SO_3^-M^+ \tag{1}$$

(where $M^+$ represents a monovalent cation)
    In any of the aspects of the method for manufacturing abrasive grains, a zeta-potential of the above-mentioned abrasive grains may be less than ~10 mV in a composition for chemical mechanical polishing containing the above-mentioned abrasive grains.

One aspect of a composition for chemical mechanical polishing according to the present invention contains:
    abrasive grains manufactured by the method according to any of the above-mentioned aspects; and
    a liquid medium.

One aspect of a composition for chemical mechanical polishing according to the present invention is a composition for chemical mechanical polishing containing:
    abrasive grains; and
    a liquid medium,
    in which a polymer chain is grafted onto a surface of the above-mentioned abrasive grains by a covalent bond, and
    the above-mentioned abrasive grains have a functional group represented by General Formula (1) on the surface thereof.

$$—SO_3^-M^+ \tag{1}$$

(where $M^+$ represents a monovalent cation)

One aspect of a composition for chemical mechanical polishing according to the present invention is a composition for chemical mechanical polishing containing:

abrasive grains; and a liquid medium, in which a polymer chain is grafted onto a surface of the above-mentioned abrasive grains by a covalent bond via —$SO_x$— (where x is an integer of 0 to 2).

In the composition for chemical mechanical polishing according to any one of the above-mentioned aspects, the composition for chemical mechanical polishing may be used for polishing a positively charged material among a plurality of materials constituting a semiconductor device at a time of chemical mechanical polishing.

In any of the aspects of the above-mentioned composition for chemical mechanical polishing, the above-mentioned positively charged material may be a silicon nitride film.

One aspect of a method for chemical mechanical polishing according to the present invention includes a step of polishing a positively charged material among a plurality of materials constituting a semiconductor device at a time of chemical mechanical polishing using the composition for chemical mechanical polishing according to any of the above-mentioned aspects.

Advantageous Effects of Invention

According to a method for manufacturing abrasive grains according to the present invention, abrasive grains for selectively polishing a silicon nitride film with respect to not only silicon oxide films but also amorphous silicon films and polysilicon films can be manufactured. Furthermore, according to a composition for chemical mechanical polishing according to the present invention, a silicon nitride film can be selectively polished with respect to not only silicon oxide films but also amorphous silicon films and polysilicon films.

DESCRIPTION OF EMBODIMENTS

Figure 1:
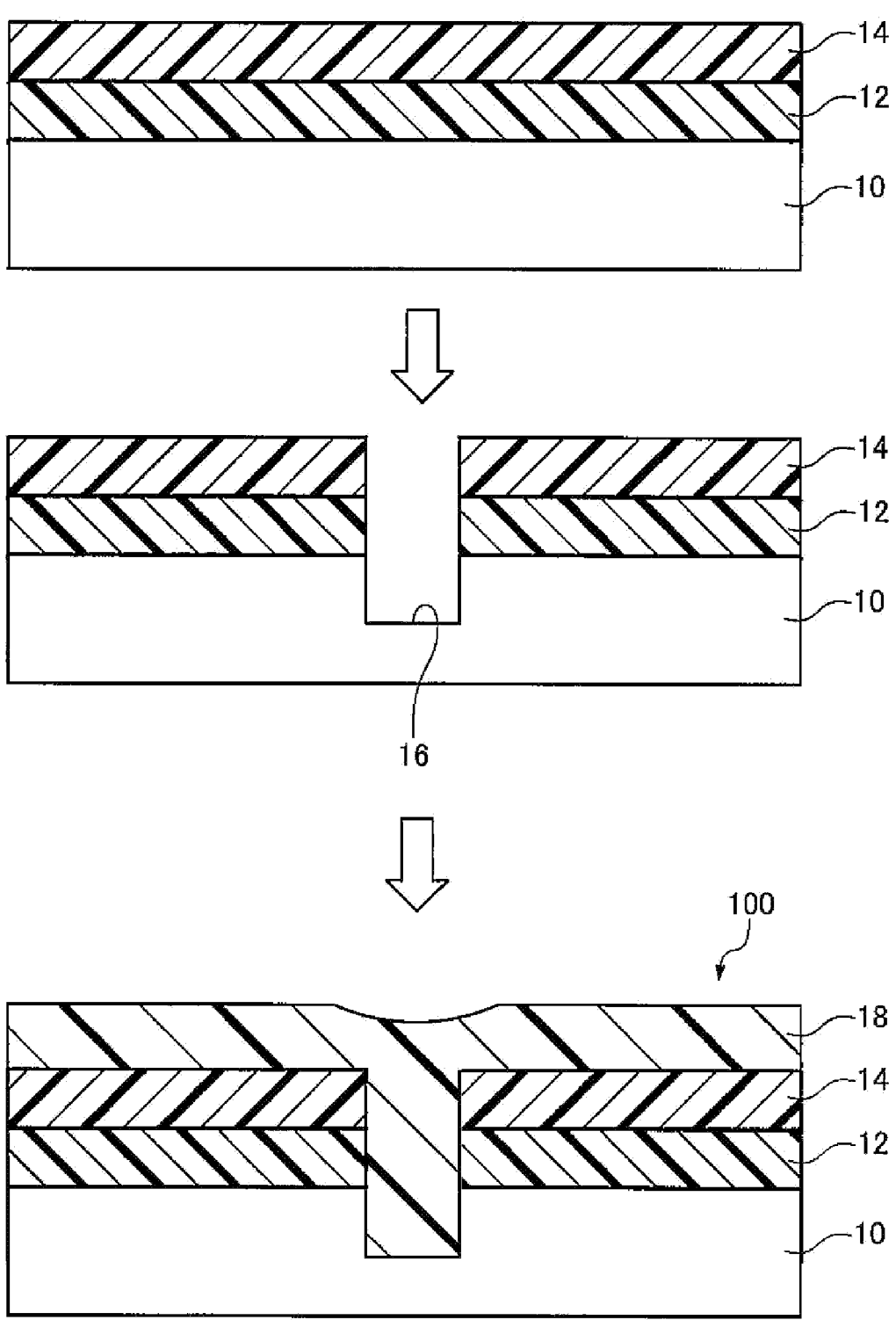
FIG. 1 is a cross-sectional view schematically showing a production step of an object to be processed in isolation between elements.

Hereinafter, suitable embodiments of the present invention will be described in detail. The present invention is not limited to the following embodiments and includes various modification examples implemented within a range not changing the gist of the present invention.

"(Meth)acrylic acid-" in the present specification is a concept including both "acrylic acid-" and "methacrylic acid-". Similarly, "(meth)acrylamide" is a concept including both "acrylamide" and "methacrylamide".

In the present specification, the numerical value range described using "X to Y" is interpreted as including the numerical value X as a lower limit value and the numerical value Y as an upper limit value.

1. METHOD FOR MANUFACTURING ABRASIVE GRAINS

A method for manufacturing abrasive grains according to one embodiment of the present invention includes: a first step of heating a mixture which contains particles having a sulfanyl group (—SH) fixed to a surface thereof via a covalent bond, and which contains a compound having a carbon-carbon unsaturated double bond; and a second step of further adding a peroxide and carrying out heating after the above-mentioned first step. According to the method for manufacturing abrasive grains according to the present embodiment, abrasive grains for selectively polishing a silicon nitride film with respect to not only silicon oxide films but also amorphous silicon films and polysilicon films can be manufactured. Hereinafter, each of the steps of the method for manufacturing abrasive grains according to the present embodiment will be described in detail.

1.1. First Step

The first step is a step of heating a mixture which contains particles having a sulfanyl group (—SH) fixed to a surface thereof via a covalent bond, and which contains a compound having a carbon-carbon unsaturated double bond. By going through the first step, particles in which a polymer chain is grafted onto the particle surface by a covalent bond via —S— can be manufactured.

In the first step, the particles having a sulfanyl group (—SH) fixed to the surface thereof via a covalent bond are used. Such particles having a sulfanyl group (—SH) fixed to the surface via a covalent bond do not include particles to which a compound having a sulfanyl group is physically or ionically adsorbed on the surface.

Materials of the particles that serve as the raw material for the abrasive grains are not particularly limited. Examples thereof include inorganic oxides such as silica, ceria, alumina, zirconia, and titania, among which silica is particularly preferable. Examples of silica include fumed silica and colloidal silica, of which colloidal silica is preferable from the viewpoint of reducing polishing defects such as scratches. Colloidal silica can be manufactured by methods disclosed in Japanese Patent Laid-Open No. 2003-109921 and the like, for example.

As a method of fixing a sulfanyl group (—SH) on the surface of silica particles via a covalent bond, methods disclosed in Japanese Patent Laid-Open No. 2010-269985; J. Ind. Eng. Chem., Vol. 12, No. 6, (2006) 911-917; and the like can be applied. For example, by sufficiently stirring silica particles and a mercapto group-containing silane coupling agent in an acidic medium, the mercapto group-containing silane coupling agent can be covalently bonded to the surfaces of the above-mentioned silica particles. Examples of the mercapto group-containing silane coupling agent include (3-mercaptopropyl)methyldimethoxysilane and (3-mercaptopropyl)trimethoxysilane.

In the first step, the compound having a carbon-carbon unsaturated double bond is used. The compound having a carbon-carbon unsaturated double bond is not particularly limited as long as it is a compound capable of reacting with the sulfanyl group (—SH) fixed to the particle surface by an enethiol reaction and bonding to the particle surface via an —S— bond. For example, by reacting a polymer having a reactive carbon-carbon unsaturated double bond, a polymer chain can be easily grafted onto the particle surface via an —S— bond. In addition, by reacting a monomer having a carbon-carbon unsaturated double bond, synthesis of a polymer and a grafting reaction of a polymer chain onto the particle surface are carried out at the same time, which makes it possible to graft a polymer chain onto the particle surface via an —S— bond.

As the above-mentioned polymer having a reactive carbon-carbon unsaturated double bond, polyoxyalkylenes having a reactive carbon-carbon unsaturated double bond can be preferably used. Polyoxyalkylenes having a reactive carbon-carbon unsaturated double bonds are, for example, compounds in which an alkylene oxide is added to allyl alcohol, and include compounds having terminals blocked with aliphatic compounds. Examples thereof include a compound in which an ethylene oxide is added to allyl alcohol, a compound in which a propylene oxide is added to allyl alcohol, a compound in which an ethylene oxide and a propylene oxide are randomly added to allyl alcohol, and a compound formed by block addition of an ethylene oxide and a propylene oxide to allyl alcohol.

Examples of specific product names of such a polymer having a reactive carbon-carbon unsaturated double bond include UNIOX PKA-5001, UNIOX PKA-5002, UNIOX PKA-5003, UNIOX PKA-5004, UNIOX PKA-5005, UNIOX PKA-5006, UNIOX PKA-5007, UNIOX PKA-5008, UNIOX PKA-5009, UNIOX PKA-5010, UNIOX PKA-5011, UNIOX PKA-5012, UNIOX PKA-5013, UNIOX PKA-5014TF, UNIOX PKA-5015, UNIOX PKA-5016, UNIOX PKA-5017, and the like which are trade names and manufactured by NOF CORPORATION.

The average molecular weight of such a compound having a carbon-carbon unsaturated double bond is preferably 100 or more, and more preferably 200 or more. The average molecular weight of such a polymer having a reactive carbon-carbon unsaturated double bond is preferably 10,000 or less, and more preferably 8,000 or less.

Examples of the above-mentioned monomer having a carbon-carbon unsaturated double bond include unsaturated carboxylic acid esters, aromatic vinyl compounds, unsaturated carboxylic acids, $\alpha,\beta$-unsaturated nitrile compounds, and other unsaturated monomers.

As the unsaturated carboxylic acid esters, a (meth)acrylic acid ester can be preferably used, and examples thereof include alkyl esters of (meth)acrylic acid and cycloalkyl esters of (meth)acrylic acid. As the alkyl esters of (meth) acrylic acid, alkyl esters of (meth)acrylic acid having an alkyl group having 1 to 10 carbon atoms are preferable, and examples thereof include methyl (meth)acrylate, ethyl (meth)acrylate, n-propyl (meth)acrylate, i-propyl (meth) acrylate, n-butyl (meth)acrylate, i-butyl (meth)acrylate, n-amyl (meth)acrylate, i-amyl (meth)acrylate, hexyl (meth) acrylate, 2-ethylhexyl (meth)acrylate, n-octyl (meth)acrylate, nonyl (meth)acrylate, and decyl (meth)acrylate. Examples of the cycloalkyl esters of (meth)acrylic acid include cyclohexyl (meth)acrylate. For the unsaturated carboxylic acid esters exemplified above, one type may be used alone, or two or more types may be used in combination. Among these, alkyl esters of (meth)acrylic acid are preferable, and it is more preferable to use one or more selected from methyl (meth)acrylate, ethyl (meth)acrylate, n-butyl (meth)acrylate, and 2-ethylhexyl (meth)acrylate.

Examples of the aromatic vinyl compounds include styrene, $\alpha$-methylstyrene, p-methylstyrene, vinyltoluene, and chlorostyrene, and can be one or more selected from these. As the aromatic vinyl compound, styrene among the above-mentioned examples is particularly preferable.

Examples of the unsaturated carboxylic acids include monocarboxylic acids or dicarboxylic acids such as acrylic acid, methacrylic acid, crotonic acid, maleic acid, fumaric acid, and itaconic acid, and one or more selected from these can be used. As the unsaturated carboxylic acid, it is preferable to use one or more selected from acrylic acid and methacrylic acid, of which acrylic acid is more preferable.

Examples of the $\alpha,\beta$-unsaturated nitrile compounds include acrylonitrile, methacrylonitrile, $\alpha$-chloroacrylonitrile, $\alpha$-ethylacrylonitrile, and vinylidene cyanide, and one or more selected from these can be used. Among these, one or more selected from the group consisting of acrylonitrile and methacrylonitrile is preferable, of which acrylonitrile is particularly preferable.

Examples of the other unsaturated monomers include alkylamides of unsaturated carboxylic acids such as (meth) acrylamide and N-methylolacrylamide; and aminoalkylamides of unsaturated carboxylic acids such as aminoethylacrylamide, dimethylaminomethylmethacrylamide, and methylaminopropylmethacrylamide, and one or more selected from these can be used.

In the first step, the mixture, which contains the particles having a sulfanyl group (—SH) fixed to the surface thereof via a covalent bond and which contains the compound having a carbon-carbon unsaturated double bond, may further contain a radical-generating agent. Using the radical-generating agent is preferable because this promotes the reaction between the sulfanyl group (—SH) fixed to the particle surface and the compound having a carbon-carbon unsaturated double bond.

Examples of the radical-generating agent include azo-based initiators such as N,N'-azobisisobutyronitrile, 2,2'-azobis[N-(2-carboxyethyl)-2-methylpropionamidine]tetrahydrate, and dimethyl N,N'-azobis(2-methylpropionate); and organic peroxide-based initiators such as benzoyl peroxide and lauroyl peroxide. It is preferable to add 0.1 to 25 parts by mass of the radical-generating agent with respect to 100 parts by mass of the compound having a carbon-carbon unsaturated double bond.

1.2. Second Step

The second step is a step of further adding a peroxide to the particles obtained in the above-mentioned first step and having a polymer chain grafted onto the surface by a covalent bond via —S— and heating. An unreacted sulfanyl group (—SH) remains on the particle surface of the particles obtained by the above-mentioned first step and having a polymer chain grafted on the surface by a covalent bond via —S—. Therefore, by further adding an appropriate amount of a peroxide and heating, the unreacted sulfanyl group (—SH) can be sulfonated to be converted into a group represented by General Formula (1).

$$—SO_3^-M^+ \qquad\qquad (1)$$

(where $M^+$ represents a monovalent cation)

Examples of the monovalent cation represented by $M^+$ in Formula (1) above include, but are not limited to, $H^+$, $Na^+$, $K^+$, and $NH_4^+$. That is, the abrasive grains obtained by the method according to the present embodiment can be rephrased to have not only a polymer chain grafted onto the particle surface by a covalent bond via —S—, but also at least one functional group selected from the group consisting of a sulfo group and a salt thereof. The term "a salt of a sulfo group" refers to a functional group in which a hydrogen ion contained in the sulfo group (—SO_3H) has been substituted with a monovalent cation such as $Li^+$, $Na^+$, K⁺, and NH₄⁺. The abrasive grains manufactured by the method according to the present embodiment are abrasive grains in which the functional group represented by General Formula (1) above is fixed to the surface thereof via a covalent bond, and do not include those in which a compound having the functional group represented by General Formula (1) above is physically or ionically adsorbed on the particle surface.

In the second step, the —S— bond, which is the site that bonds the particle surface and the polymer chain, may be oxidized to be converted to a bond such as —SO— or —SO₂—. Therefore, the abrasive grains manufactured by the method according to the present embodiment can be rephrased to have a polymer chain grafted onto the particle surface by a covalent bond via —SO$_x$— (where x is an integer of 0 to 2).

1.3. Characteristics of Abrasive Grains

1.3.1. Zeta-Potential

The zeta-potential of the abrasive grains manufactured by the method according to the present embodiment in a composition for chemical mechanical polishing is preferably less than –10 mV, more preferably –60 mV or more and less than –10 mV, and particularly preferably is –55 mV or more and –20 mV or less. The abrasive grains manufactured by the method according to the present embodiment can be used by being added to a composition for chemical mechanical polishing to be described later. The pH of such a composition for chemical mechanical polishing is preferably 2 or more and 5 or less, as will be described later. In the range in which the pH of the composition for chemical mechanical polishing is 2 or more and 5 or less, the surface of a silicon nitride film is likely to be positively charged. Therefore, when the zeta-potential of the abrasive grains having any pH in the range of 2 or more and 5 or less is less than –10 mV, the abrasive grains are likely to be localized on the surface of the silicon nitride film due to the attractive force based on the electrostatic interaction between the abrasive grains and the silicon nitride film, which makes it possible to realize polishing of the silicon nitride film at a high speed. On the other hand, when the zeta-potential of the abrasive grains having a pH in the range of 2 or more and 5 or less is –10 mV or more, a polishing rate of the silicon nitride film may be insufficient because the electrostatic interaction between the abrasive grains and the silicon nitride film is reduced, or a repulsive force acts. In order to make the zeta-potential of the abrasive grains less than –10 mV when the composition for chemical mechanical polishing has any pH in the range of 2 or more and 5 or less, for example, the zeta-potential can be adjusted by increasing or decreasing the addition amount of the mercapto group-containing silane coupling agent in the above-mentioned method of fixing a sulfanyl group (—SH) to the surface of the silica particles via a covalent bond.

The zeta-potential of the abrasive grains can be measured by a conventional method using a zeta-potential measurement device in which a laser Doppler method is used as the measurement principle. Examples of such a zeta-potential measurement device include "Zeta Potential Analyzer" manufactured by Brookhaven Instruments Corporation, "ELSZ-1000ZS" manufactured by Otsuka Electronics Co., Ltd., and "DT-300" manufactured by Dispersion Technology Inc.

1.3.2. Average Secondary Particle Size

The average secondary particle size of the abrasive grains manufactured by the method according to the present embodiment is preferably 30 nm or more, more preferably 40 nm or more, and particularly preferably 50 nm or more. The average secondary particle size of the abrasive grains manufactured by the method according to the present embodiment is preferably 100 nm or less, more preferably 95 nm or less, and particularly preferably 90 nm or less. When the average secondary particle size of the abrasive grains is within the above-mentioned range, a silicon nitride film as a polishing target can be polished at a practical polishing rate in some cases while reducing the generation of polishing defects. The average secondary particle size of the abrasive grains can be measured by using a dynamic light scattering particle size distribution analyzer. Examples of such a dynamic light scattering particle size distribution analyzer include "Nanoparticle Analyzer SZ-100" manufactured by HORIBA, Ltd.

2. COMPOSITION FOR CHEMICAL MECHANICAL POLISHING

The composition for chemical mechanical polishing according to one embodiment of the present invention contains the abrasive grains manufactured by the method described above and a liquid medium. Hereinafter, each of the components contained in the composition for chemical mechanical polishing according to the present embodiment will be described in detail.

2.1. Abrasive Grains

The composition for chemical mechanical polishing according to the present embodiment contains the abrasive grains manufactured by the method described above. As described above, a polymer chain is grafted onto the surface of the abrasive grains by a covalent bond, and the abrasive grains have the functional group represented by General Formula (1) on the surface thereof.

$$—SO_3^-M^+ \qquad (1)$$

(where M⁺ represents a monovalent cation)

In the abrasive grains obtained by going through the above-mentioned second step, the —S— bond, which is the site that bonds the particle surface and the polymer chain, may be oxidized to be converted to a bond such as —SO— or —SO₂—. Therefore, the abrasive grains can be rephrased to have a polymer chain grafted onto the surface thereof by a covalent bond via —SO$_x$— (where x is an integer of 0 to 2).

Since the method for manufacturing such abrasive grains and the characteristics thereof have been described above, the description thereof will be omitted.

The content of the abrasive grains is preferably 1% by mass or more, more preferably 2% by mass or more, and particularly preferably 3% by mass or more when the total mass of the composition for chemical mechanical polishing is 100% by mass. The content of the abrasive grains is preferably 10% by mass or less, more preferably 8% by mass or less, and particularly preferably 6% by mass or less when the total mass of the composition for chemical mechanical polishing is 100% by mass. When the content of the abrasive grains is within the above-mentioned range, polishing of a silicon nitride film as a polishing target at a high speed can be realized, and the preservation stability of the composition for chemical mechanical polishing may also be improved.

2.2. Liquid Medium

The composition for chemical mechanical polishing according to the present embodiment contains a liquid medium. Examples of the liquid medium include water, a mixed medium of water and alcohol, and a mixed medium containing water and an organic solvent compatible with water. Among these, it is preferable to use water or a mixed medium of water and alcohol, and it is more preferable to use water. Water is not particularly limited, but pure water is preferable. The water content is not particularly limited as long as water is blended as the remainder of the constituent materials of the composition for chemical mechanical polishing.

2.3. Other Additives

The composition for chemical mechanical polishing according to the present embodiment may further contain additives such as acidic compounds, water-soluble polymers, surfactants, oxidizing agents, anti-corrosive agents, and pH adjusters, if necessary. Each of the additives will be described below.

<Acidic Compound>

The composition for chemical mechanical polishing according to the present embodiment may contain an acidic compound. By incorporating the acidic compound, a synergistic effect with the above-mentioned abrasive grains is obtained, by which the polishing rate of a silicon nitride film can be improved in some cases.

Examples of such an acidic compound include organic acids and inorganic acids. Examples of organic acids include saturated carboxylic acids such as malonic acid, citric acid, malic acid, tartaric acid, oxalic acid, lactic acid, and iminodiacetic acid; unsaturated monocarboxylic acids such as acrylic acid, methacrylic acid, crotonic acid, 2-butenoic acid, 2-methyl-3-butenoic acid, 2-hexenoic acid, and 3-methyl-2-hexenoic acid; unsaturated dicarboxylic acids such as maleic acid, fumaric acid, citraconic acid, mesaconic acid, 2-pentenedioic acid, itaconic acid, allylmalonic acid, isopropylidene succinic acid, 2,4-hexadienedioic acid, and acetylenedicarboxylic acid; aromatic carboxylic acids such as trimellitic acid; and salts of these. Examples of inorganic acids include phosphoric acid, sulfuric acid, hydrochloric acid, nitric acid, and salts of these. For these acidic compounds, one type may be used alone, or two or more types may be used in combination.

When the composition for chemical mechanical polishing according to the present embodiment contains an acidic compound, the content of the acidic compound is preferably 0.001% to 5% by mass, more preferably 0.003% to 1% by mass, and particularly preferably 0.005% to 0.5% by mass when the total mass of the composition for chemical mechanical polishing is 100% by mass.

<Water-Soluble Polymer>

The composition for chemical mechanical polishing according to the present embodiment may contain a water-soluble polymer. The water-soluble polymer has the effect of reducing polishing friction by being adsorbed on the surface of a silicon nitride film. Due to this effect, the generation of dishing in a silicon nitride film can be greatly reduced in some cases.

Examples of water-soluble polymers include polyethyleneimine, poly(meth)acrylamide, poly N-alkyl(meth)acrylamide, poly(meth)acrylic acid, polyoxyethylene alkylamine, polyvinyl alcohol, polyvinyl alkyl ether, polyvinylpyrrolidone, hydroxyethyl cellulose, carboxymethyl cellulose, copolymers of (meth)acrylic acid and maleic acid, and polymeric amine compounds such as poly(meth)acrylamine. Among these, when thermoresponsive polymers such as polyvinyl methyl ether and poly(N-isopropylacrylamide), and polymeric amine compounds such as poly(meth)acrylamine are added, the generation of dishing in a silicon nitride film can be more effectively reduced in some cases without decreasing the polishing rate of the silicon nitride film.

The weight-average molecular weight (Mw) of the water-soluble polymer is preferably 1,000 to 1,000,000, and more preferably 3,000 to 800,000. When the weight-average molecular weight of the water-soluble polymer is within the above-mentioned range, the water-soluble polymer is easily adsorbed on the surface of a silicon nitride film, by which polishing friction can be further reduced in some cases. As a result, the generation of dishing in a silicon nitride film can be more effectively reduced in some cases. The term "weight-average molecular weight (Mw)" in the present specification refers to a weight-average molecular weight in terms of polyethylene glycol measured by gel permeation chromatography (GPC).

When the composition for chemical mechanical polishing according to the present embodiment contains the water-soluble polymer, the content of the water-soluble polymer is preferably 0.005% to 0.5% by mass and is more preferably 0.01% to 0.2% by mass when the total mass of the composition for chemical mechanical polishing is 100% by mass.

The content of the water-soluble polymer depends on the weight-average molecular weight (Mw) of the water-soluble polymer, but is preferably adjusted such that the viscosity of the composition for chemical mechanical polishing at 25° C. is equal to or more than 0.5 mPa·s and less than 10 mPa·s. When the viscosity of the composition for chemical mechanical polishing at 25° C. is equal to or more than 0.5 mPa·s and less than 10 mPa·s, a silicon nitride film is easily polished at a high speed, and the composition for chemical mechanical polishing can be stably supplied on a polishing cloth because the viscosity is appropriate.

<Surfactant>

The composition for chemical mechanical polishing according to the present embodiment may contain a surfactant. By incorporating the surfactant, an appropriate viscosity can be imparted to the composition for chemical mechanical polishing in some cases. The viscosity of the composition for chemical mechanical polishing is preferably adjusted to be equal to or more than 0.5 mPa·s and less than 10 mPa·s at 25° C.

The surfactant is not particularly limited, and anionic surfactants, cationic surfactants, nonionic surfactants, and the like can be used.

Examples of anionic surfactants include carboxylate salts such as fatty acid soaps and alkyl ether carboxylates; sulfonates such as alkylbenzenesulfonates, alkylnaphthalenesulfonates, and α-olefinsulfonates; sulfates such as higher alcohol sulfates, alkyl ether sulfates, and polyoxyethylene alkylphenyl ether sulfates; and fluorine-containing surfactants such as perfluoroalkyl compounds. Examples of cationic surfactants include aliphatic amine salts and aliphatic ammonium salts. Examples of nonionic surfactants include nonionic surfactants having a triple bond such as acetylene glycol, acetylene glycol ethylene oxide adducts, and acetylene alcohol; and polyethylene glycol-based surfactants. For these surfactants, one type may be used alone or two or more types may be used in combination.

When the composition for chemical mechanical polishing according to the present embodiment contains a surfactant, the content of the surfactant is preferably 0.001% to 5% by mass, more preferably 0.003% to 3% by mass, and particularly preferably 0.005% to 1% by mass when the total mass of the composition for chemical mechanical polishing is 100% by mass.

<Oxidizing Agent>

The composition for chemical mechanical polishing according to the present embodiment may contain an oxidizing agent. By incorporating the oxidizing agent, a silicon nitride film can be oxidized to form a fragile modified layer, and thereby the polishing rate is improved in some cases.

Examples of oxidizing agents include ammonium persulfate, potassium persulfate, hydrogen peroxide, ferric nitrate, diammonium cerium nitrate, potassium hypochlorite, ozone, potassium periodate, and peracetic acid. Among these oxidizing agents, in consideration of oxidizing power and ease of handling, ammonium persulfate, potassium persulfate, and hydrogen peroxide are preferable, and hydrogen peroxide is more preferable. For these oxidizing agents, one type may be used alone or two or more types may be used in combination.

When the composition for chemical mechanical polishing according to the present embodiment contains an oxidizing agent, the content of the oxidizing agent is preferably 0.1% to 5% by mass, more preferably 0.3% to 4% by mass, and particularly preferably 0.5% to 3% by mass when the total mass of the composition for chemical mechanical polishing is 100% by mass. Because the oxidizing agent is easily decomposed in the composition for chemical mechanical polishing, it is desirable to add the oxidizing agent immediately before performing the polishing step of CMP.

<Anti-Corrosive Agent>

The composition for chemical mechanical polishing according to the present embodiment may contain an anti-corrosive agent. Examples of anti-corrosive agents include benzotriazole and derivatives thereof. The term "benzotriazole derivatives" refers to one in which one or two or more hydrogen atoms of benzotriazole have been substituted with a carboxy group, a methyl group, an amino group, a hydroxy group, or the like, for example. Specific examples of the benzotriazole derivatives include 4-carboxybenzotriazole, 7-carboxybenzotriazole, benzotriazole butyl ester, 1-hydroxymethylbenzotriazole, 1-hydroxybenzotriazole, and salts of these.

When the composition for chemical mechanical polishing according to the present embodiment contains the anti-corrosive agent, the content of the anti-corrosive agent is preferably 1% by mass or less and more preferably 0.001% to 0.1% by mass when the total mass of the composition for chemical mechanical polishing is 100% by mass.

<pH Adjuster>

The composition for chemical mechanical polishing according to the present embodiment may further contain a pH adjuster, if necessary. Examples of pH adjusters include bases such as potassium hydroxide, ethylenediamine, monoethanolamine, tetramethylammonium hydroxide (TMAH), tetraethylammonium hydroxide (TEAH), and ammonia, and one or more of these can be used.

2.4. pH

The pH of the composition for chemical mechanical polishing according to the present embodiment is not particularly limited, but is preferably 2 or more and 5 or less, and more preferably 2 or more and 4 or less. In the range in which the pH of the composition for chemical mechanical polishing is 2 or more and 5 or less, the surface of a silicon nitride film is likely to be positively charged, and thereby the zeta-potential of the abrasive grains is likely to become less than ~10 mV. Therefore, the abrasive grains are likely to be localized on the surface of the silicon nitride film due to the attractive force based on the electrostatic interaction between the abrasive grains and the silicon nitride film, which makes it possible to realize polishing of the silicon nitride film at a high speed. Furthermore, when the pH of the composition for chemical mechanical polishing is 2 or more and 5 or less, this is preferable because then the dispersibility of the abrasive grains is improved, and thereby the preservation stability of the composition for chemical mechanical polishing becomes favorable.

The pH of the composition for chemical mechanical polishing according to the present embodiment can be adjusted by, for example, appropriately increasing or decreasing the contents of the above-mentioned acidic compound, the above-mentioned pH adjuster, and the like.

In the present specification, a pH refers to a hydrogen ion exponent, and a value thereof is measured under the conditions of 25° C. and 1 atm using a commercially available pH meter (for example, a desktop type pH meter, manufactured by HORIBA, Ltd.).

2.5. Usage

The composition for chemical mechanical polishing according to the present embodiment can be used as a polishing material for polishing a positively charged material among a plurality of materials constituting a semiconductor device at the time of chemical mechanical polishing. The composition for chemical mechanical polishing according to the present embodiment is particularly adapted for usage in polishing of a silicon nitride film among materials that are positively charged at the time of chemical mechanical polishing, and can be used for isolation between elements in a semiconductor manufacturing process, for example.

2.6. Method for Preparing Composition for Chemical Mechanical Polishing

The composition for chemical mechanical polishing according to the present embodiment can be prepared by dissolving or dispersing each of the above-mentioned components in a liquid medium such as water. A method of dissolving or dispersing is not particularly limited, and any method may be applied as long as it enables homogeneous dissolving or dispersing. In addition, a mixing order and a mixing method of each of the above-mentioned components are not particularly limited.

In addition, it is also possible to prepare the composition for chemical mechanical polishing according to the present embodiment as a stock solution of a concentrated type and dilute it with a liquid medium such as water at the time of use.

3. METHOD FOR CHEMICAL MECHANICAL POLISHING

A polishing method according to one embodiment of the present invention includes a step of polishing a positively charged material among a plurality of materials constituting a semiconductor device at the time of chemical mechanical polishing using the above-mentioned composition for chemical mechanical polishing. The polishing method according to the present embodiment is adapted for usage in selective polishing of a silicon nitride film among materials that are positively charged at the time of chemical mechanical polishing, and can be applied to isolation between elements in a semiconductor manufacturing process, for example. As a specific example of the method for chemical mechanical polishing according to the present embodiment, isolation between elements will be described below with reference to the drawings.

3.1. Object to be Processed

FIG. 1 is a cross-sectional view schematically showing a production step of an object to be processed in isolation between elements. An object to be processed 100 is produced by going through the following steps (1) to (3).

(1) First, as shown in FIG. 1, a silicon wafer 10 is prepared. Functional devices such as transistors (not shown) may be formed on the silicon wafer 10. Subsequently, a thermal oxide film 12 is formed on the silicon wafer 10 using a thermal oxidation method. Subsequently, a silicon nitride film 14 is deposited on the thermal oxide film 12. The silicon nitride film 14 functions as a stopper film. The thermal oxide film 12 is interposed between the silicon wafer 10 and the silicon nitride film 14, because directly forming the silicon nitride film 14 on the silicon wafer 10 may adversely affect the silicon wafer 10, and in order to prevent separation due to the difference in thermal expansion between the silicon wafer 10 and the silicon nitride film 14.

(2) Subsequently, the silicon nitride film 14 is patterned. Using the obtained pattern as a mask, a groove 16 is formed by dry etching.

(3) Subsequently, a silicon oxide film 18 is caused to grow inside the groove 16 by applying a CVD method.

By the steps described above, the object to be processed 100 is formed.

3.2. Method for Chemical Mechanical Polishing

3.2.1. First Polishing Step

Figure 2:
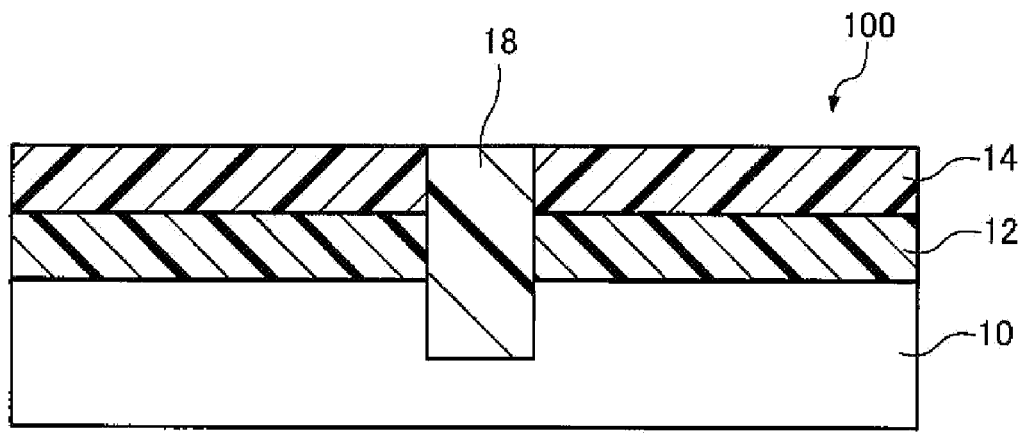
FIG. 2 is a cross-sectional view schematically showing the object to be processed after a first polishing step.

FIG. 2 is a cross-sectional view schematically showing the object to be processed at the completion of a first polishing step. As shown in FIG. 2, in the first polishing step, the silicon oxide film 18 in which the silicon nitride film 14 as a stopper is embedded is polished by CMP using a polishing apparatus 200 shown in FIG. 4. In the first polishing step, CMP is performed using a composition for chemical mechanical polishing which is for silicon oxide films.

3.2.2. Second Polishing Step

Figure 3:
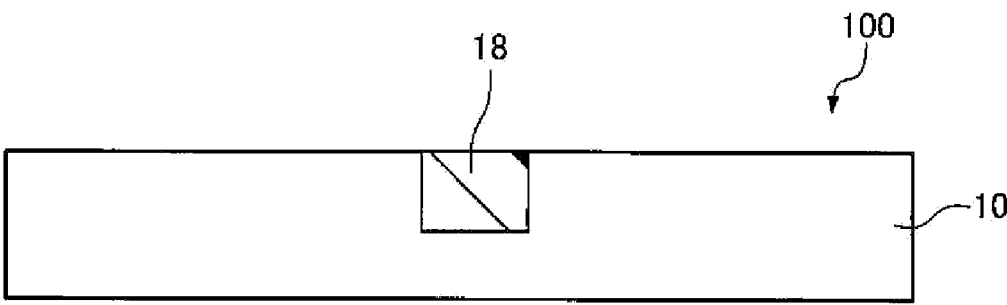
FIG. 3 is a cross-sectional view schematically showing the object to be processed after a second polishing step.

FIG. 3 is a cross-sectional view schematically showing the object to be processed at the completion of a second polishing step. As shown in FIG. 3, in the second polishing step, using the polishing apparatus 200 shown in FIG. 4, the silicon nitride film 14, and the silicon oxide film 18 embedded in the groove 16 are polished to be flattened using the above-mentioned composition for chemical mechanical polishing. Since the above-mentioned composition for chemical mechanical polishing can selectively polish the silicon nitride film 14, the composition for chemical mechanical polishing is adapted for the second polishing step. Thereafter, by further continuing CMP or performing wet etching to remove the thermal oxide film 12, so-called isolation between elements can be performed.

3.3. Chemical Mechanical Polishing Apparatus

Figure 4:
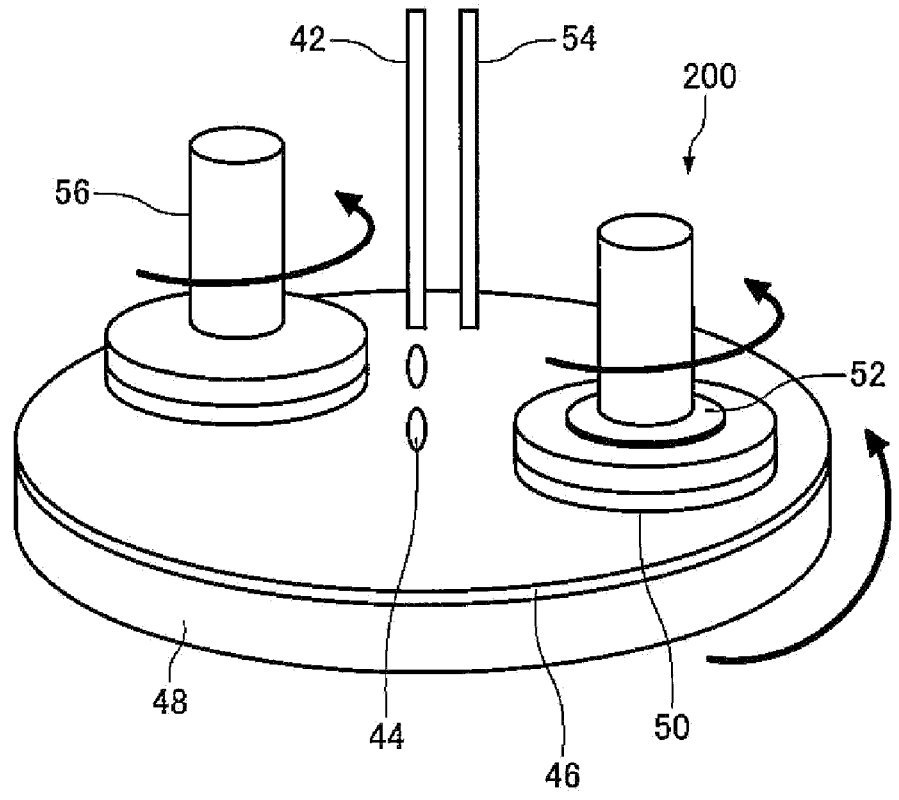
FIG. 4 is a perspective view schematically showing a chemical mechanical polishing apparatus.

For the above-mentioned first polishing step and second polishing step, a polishing apparatus 200 as shown in FIG. 4 can be used, for example. FIG. 4 is a perspective view schematically showing a polishing apparatus 200. The above-mentioned first polishing step and the second polishing step are performed by contacting a carrier head 52 holding a semiconductor substrate 50 while supplying a slurry (composition for chemical mechanical polishing) 44 from a slurry supply nozzle 42, and rotating a turntable 48 on which a polishing cloth 46 is attached. FIG. 4 also shows a water supply nozzle 54 and a dresser 56.

The polishing load of the carrier head 52 can be selected within the range of 10 to 980 hPa, and preferably 30 to 490 hPa. In addition, the rotation speed of the turntable 48 and the carrier head 52 can be appropriately selected within the range of 10 to 400 rpm and is preferably 30 to 150 rpm. The flow rate of the slurry (composition for chemical mechanical polishing) 44 supplied from the slurry supply nozzle 42 can be selected within the range of 10 to 1,000 mL/minute and is preferably 50 to 400 mL/minute.

Examples of commercially available polishing apparatuses include models "EPO-112" and "EPO-222" manufactured by Ebara Corporation; models "LGP-510" and "LGP-552" manufactured by Lapmaster Sft Corporation; models "Mina" and "Reflexion" manufactured by Applied Materials, Inc.; a model "POLI-400L" manufactured by G&P TECHNOLOGY; and a model "Reflexion LK" manufactured by AMAT.

4. EXAMPLES

Hereinafter, the present invention will be described with reference to examples, but the present invention is not limited to these examples. "Parts" and "%" in the present examples are based on mass unless explicitly described otherwise.

4.1. Manufacture of Abrasive Grains

4.1.1. Synthesis of Silica Particles A 100 parts by mass of tetramethyl orthosilicate (manufactured by Tama Chemicals Co., Ltd.) and 26.8 parts by mass of methanol were mixed at normal temperature and normal pressure to produce a monomer solution. Subsequently, 61.2 parts by mass of an aqueous ammonia solution (28% by mass), 98.6 parts by mass of water, and 791.4 parts by mass of methanol were put into a reaction vessel, and while stirring at 35° C., the monomer solution produced above was gradually added over 30 minutes. Thereafter, heating was performed to 90° C., which was held for 6 hours. Thereafter, 341 parts by mass of water was added to concentrate the reaction solution under reduced pressure, and thereby a dispersion liquid of silica particles A in which the concentration in terms of silica was 20% by mass was produced.

4.1.2. Synthesis of Silica Particles B 100 parts by mass of tetramethyl orthosilicate (manufactured by Tama Chemicals Co., Ltd.) was added to 1216 parts by mass of water under normal temperature and normal pressure while stirring, and the mixture was reacted for 1 hour to produce a hydrolyzed solution of tetramethyl orthosilicate. Subsequently, while stirring a mixed solution of 0.2 parts by mass of tetramethylammonium hydroxide (manufactured by FUJIFILM Wako Pure Chemical Corporation, 1N aqueous solution) heated to 80° C. and 1737 parts by mass of water, all of the previously produced hydrolyzed solution of tetramethyl orthosilicate was added at the rate of 6 mL/minute. When the pH of the solution decreased to 6.35 in the addition process, a 1N aqueous solution of tetramethylammonium hydroxide was sequentially added to adjust the reaction solution to about a pH of 8. After the addition was completed, filtration with a 90 μm mesh filter was performed, and concentration under reduced pressure was performed last to produce a dispersion liquid of silica particles B in which the concentration in terms of silica was 20% by mass and which had particles linked in a beaded shape.

4.1.3. Synthesis of Silica Particles C

While stirring a mixed solution of 0.2 parts by mass of triethanolamine (manufactured by FUJIFILM Wako Pure Chemical Corporation) heated to 70° C. and 557 parts by mass of water, 100 parts by mass of tetramethyl orthosilicate (manufactured by Tama Chemicals Co., Ltd.) was added over 3 hours. Thereafter, the mixed solution was heated to 90° C. and concentrated under reduced pressure so that the total amount was 324 parts by mass. Subsequently, after cooling the reaction solution to 40° C., 3354 parts by mass of water and 3.6 parts by mass of triethanolamine were added. Thereafter, heating to 80° C. was performed, and 1464 parts by mass of tetramethyl orthosilicate (manufactured by Tama Chemicals Co., Ltd.) was added over 3 hours. After the addition was completed, the reaction solution was heated to 90° C., and 2114 parts by mass of water was further added to cause concentration under reduced pressure, thereby producing a dispersion liquid of silica particles C in which the concentration in terms of silica was 20% by mass and which had a plurality of protrusions on the surface.

The protrusion referred to herein has a height and a width which are sufficiently smaller than the particle size of the silica particles C. The average number of the protrusions on the surface of the silica particles C is preferably 3 or more and is more preferably 5 or more per particle. It can be said that the silica particles C are particles having a peculiar shape such as a so-called confetti-like shape.

4.2. Example 1

4.2.1. Production of Abrasive Grains 100 parts by mass of the dispersion liquid of silica particles A produced above was heated to 60° C., and while vigorously stirring, 0.12 parts by mass of (3-mercaptopropyl)trimethoxysilane (manufactured by FUJIFILM Wako Pure Chemical Corporation) as a graft linker was added dropwise to further continue stirring at 60° C. for 2 hours.

Thereafter, the solution was heated to 80° C., 0.32 parts by mass of allylated polyether (manufactured by NOF CORPORATION, product name "UNIOX PKA-5013", average molecular weight 2000) as a graft polymer was further added, 0.07 parts by mass of a radical-generating agent (manufactured by FUJIFILM Wako Pure Chemical Corporation, product name "VA-057") was added thereafter, and the temperature was further maintained at 80° C. for 3 hours.

Lastly, the solution was cooled to 60° C., 0.54 parts by mass of a hydrogen peroxide solution (manufactured by FUJIFILM Wako Pure Chemical Corporation, 35% by mass aqueous solution) was added, and the temperature was maintained at 60° C. for 2 hours to produce abrasive grains.

4.2.2. Preparation of Composition for Chemical Mechanical Polishing

The abrasive grains produced above were added so that the concentration in terms of silica was 2% by mass, and phosphoric acid and water were further added so that the pH was 2.1. Thereafter, filtration was performed with a filter having the pore diameter of 0.3 μm to obtain a composition for chemical mechanical polishing.

4.2.3. Evaluation of Composition for Chemical Mechanical Polishing

<Measurement of Zeta-Potential>

The zeta-potential (surface electric charge) of the abrasive grains contained in the composition for chemical mechanical polishing produced above was measured using an ultrasonic particle size distribution/zeta-potential measurement device (manufactured by Dispersion Technology Inc., model "DT-300"). The results thereof are shown in Table 1 below.

<Measurement of Average Secondary Particle Size>

The average secondary particle size of the abrasive grains contained in the composition for chemical mechanical polishing produced above was measured using a Nanoparticle Analyzer SZ-100 manufactured by HORIBA, Ltd. The results thereof are shown in Table 1 below.

<Polishing Rate Evaluation>

Using the composition for chemical mechanical polishing produced above, chemical mechanical polishing was performed on each of a 12-inch silicon substrate with a silicon nitride film of 250 nm, a 12-inch silicon substrate with a silicon oxide film of 2000 nm, a 12-inch silicon substrate with an amorphous silicon film of 200 nm, and a 12-inch silicon substrate with a polysilicon film of 500 nm as polishing target objects using a chemical mechanical polishing apparatus (manufactured by G&P TECHNOLOGY, model "POLI-400L") under the following condition. Each of film thicknesses before and after polishing was measured using a noncontact type optical film thickness measurement device (manufactured by Nanometrics Japan Ltd., model "NANOSPEC 6100").

(Polishing Condition)

Polishing pad: manufactured by Dow, model number "IK4010"

Carrier head load: 129 $g/cm^2$

Surface plate rotation speed: 100 rpm

Polishing head rotation speed: 90 rpm

Supply amount of composition for chemical mechanical polishing: 50 mL/minute (Evaluation Criteria)

When the ratios of the polishing rates of the silicon oxide film, the amorphous silicon film, and the polysilicon film to that of the silicon nitride film were all 5.0 or more, this was determined to be favorable because the silicon nitride film could be selectively polished.

When at least any of ratios of the polishing rates of the silicon oxide film, the amorphous silicon film, and the polysilicon film to that of the silicon nitride film was less than 5.0, this was determined to be poor because the silicon nitride film could not be selectively polished in some cases.

4.3. Examples 2 to 18

Abrasive grains were produced in the same manner as in Example 1 except that in "4.2.1. Production of abrasive grains" of Example 1 described above, the type and amounts shown in Table 1 below or Table 2 below were used for silica particles, a mercapto group-containing silane coupling agent, a compound having a carbon-carbon unsaturated double bond, a radical-generating agent, and a hydrogen peroxide.

The abrasive grains produced above were added so that the concentration in terms of silica was 2% by mass, and phosphoric acid and water were added so that the pH was as shown in Table 1 below or Table 2 below. Thereafter, filtration was performed with a filter having the pore diameter of 0.3 μm to obtain each of compositions for chemical mechanical polishing. Using the obtained compositions for chemical mechanical polishing, the zeta-potentials and the average secondary particle sizes of the abrasive grains were measured in the same manner as in Example 1, and the polishing rates were evaluated. The results are shown in Table 1 below or Table 2 below.

4.4. Comparative Example 1

A composition for chemical mechanical polishing was produced in the same manner as in Example 1 except that silica particles A not having a polymer chain grafted onto the particle surface were used as themselves as abrasive grains, and the polishing rate was evaluated. The results are shown in Table 2 below.

4.5. Comparative Example 2

A composition for chemical mechanical polishing was produced in the same manner as in Example 1 except that abrasive grains not having a polymer chain grafted were used, the abrasive grains being particles in which a sulfanyl group (—SH) was fixed to the surface via a covalent bond by reacting the surface of the silica particles A using a mercapto group-containing silane coupling agent, and the polishing rate was evaluated. The results are shown in Table 2 below.

4.6. Comparative Example 3

A composition for chemical mechanical polishing was produced in the same manner as in Example 1 except that abrasive grains having a —SO₃H group on the surface but not having a polymer chain grafted were used, the abrasive grains being obtained by treating, with an oxidizing agent, particles in which a sulfanyl group (—SH) was fixed to the surface via a covalent bond by reacting the surface of the silica particles A using a mercapto group-containing silane coupling agent, and the polishing rate was evaluated. The results are shown in Table 2 below.

4.7. Comparative Example 4

After the step of mixing particles in which a sulfanyl group (—SH) was fixed to the surface via a covalent bond by reacting the surface of the silica particles A using a mercapto group-containing silane coupling agent, a compound having a carbon-carbon unsaturated double bond, and a radical-generating agent, and heating them, abrasive grains were produced as they were without further adding a peroxide. However, because agglomeration occurred, the composition for chemical mechanical polishing could not be produced by filtration through a filter having the pore diameter of 0.3 μm, and therefore the polishing rate could not be evaluated.

4.8. Evaluation Results

Table 1 below and Table 2 below show the reagents and the addition amounts used in the manufacturing steps for the abrasive grains in each of the examples and each of the comparative examples, and each of the evaluation results of the compositions for chemical mechanical polishing.

TABLE 1

| | | | | Example 1 | Example 2 | Example 3 | Example 4 | Example 5 | Example 6 |
|---|---|---|---|---|---|---|---|---|---|
| Composition for chemical mechanical polishing | Abrasive grain | Silica particle | Type | Silica particle A | Silica particle A | Silica particle A | Silica particle A | Silica particle A | Silica particle A |
| | | | Addition amount (number of parts) | 100 | 100 | 100 | 100 | 100 | 100 |
| | | Mercapto group-containing silane coupling agent | Addition amount (number of parts) | 0.12 | 0.6 | 0.6 | 1.2 | 1.2 | 0.12 |
| | | Compound having carbon-carbon unsaturated double bond | Type | PKA-5013 | PKA-5013 | PKA-5013 | PKA-5013 | PKA-5013 | PKA-5013 |
| | | | Addition amount (number of parts) | 0.32 | 0.32 | 1.6 | 3.2 | 6.4 | 0.32 |
| | | Radical-generating agent | Type | VA-057 | VA-057 | VA-057 | VA-057 | VA-057 | VA-057 |
| | | | Addition amount (number of parts) | 0.07 | 0.07 | 0.35 | 0.7 | 1.4 | 0.07 |
| | | Hydrogen peroxide (35% by mass aqueous solution) (number of parts) | | 0.54 | 2.69 | 2.69 | 5.37 | 5.37 | 0.54 |
| | | Zeta-potential (mV) | | −21 | −40 | −30 | −50 | −45 | −25 |
| | | Average secondary particle size (nm) | | 93 | 70 | 83 | 65 | 68 | 80 |
| | | Mercapto group-containing silane coupling agent/compound having carbon-carbon unsaturated double bond (molar ratio) | | 4 | 20 | 4 | 4 | 8 | 4 |
| | | Compound having carbon-carbon unsaturated double bond/radical-generating agent (molar ratio) | | 1 | 1 | 1 | 1 | 1 | 1 |
| | | pH | | 2.1 | 2.1 | 2.1 | 2.1 | 2.1 | 3.0 |

TABLE 1-continued

| Polishing evaluation | Polishing rate | Silicon nitride film (Å/min) | 545 | 605 | 583 | 650 | 620 | 545 |
|---|---|---|---|---|---|---|---|---|
| | | Silicon oxide film (Å/min) | 42 | 32 | 21 | 18 | 15 | 38 |
| | | Amorphous silicon film (Å/min) | 35 | 34 | 22 | 15 | 12 | 30 |
| | | Polysilicon film (Å/min) | 94 | 89 | 61 | 40 | 30 | 89 |
| | Polishing rate ratio | Silicon nitride film/silicon oxide film | 13.0 | 18.9 | 27.8 | 36.1 | 41.3 | 14.3 |
| | | Silicon nitride film/amorphous silicon film | 15.6 | 17.8 | 26.5 | 43.3 | 51.7 | 18.2 |
| | | Silicon nitride film/ polysilicon film | 5.8 | 6.8 | 9.6 | 16.3 | 20.7 | 6.1 |

| | | | | Example 7 | Example 8 | Example 9 | Example 10 | Example 11 |
|---|---|---|---|---|---|---|---|---|
| Composition for chemical mechanical polishing | Abrasive grain | Silica particle | Type | Silica particle A | Silica particle A | Silica particle B | Silica particle C | Silica particle A |
| | | | Addition amount (number of parts) | 100 | 100 | 100 | 100 | 100 |
| | | Mercapto group-containing silane coupling agent | Addition amount (number of parts) | 0.12 | 0.12 | 0.12 | 0.12 | 0.12 |
| | | Compound having carbon-carbon unsaturated double bond | Type | PKA-5013 | PKA-5013 | PKA-5013 | PKA-5013 | PKA-5001 |
| | | | Addition amount (number of parts) | 0.32 | 0.32 | 0.32 | 0.32 | 0.032 |
| | | Radical-generating agent | Type | VA-057 | VA-057 | VA-057 | VA-057 | VA-057 |
| | | | Addition amount (number of parts) | 0.07 | 0.07 | 0.07 | 0.07 | 0.07 |
| | | Hydrogen peroxide (35% by mass aqueous solution) (number of parts) | | 0.54 | 0.54 | 0.54 | 0.54 | 0.54 |
| | | Zeta-potential (mV) | | −28 | −29 | −22 | −21 | −23 |
| | | Average secondary particle size (nm) | | 75 | 74 | 82 | 75 | 59 |
| | | Mercapto group-containing silane coupling agent/ compound having carbon-carbon unsaturated double bond (molar ratio) | | 4 | 4 | 4 | 4 | 4 |
| | | Compound having carbon-carbon unsaturated double bond/radical-generating agent (molar ratio) | | 1 | 1 | 1 | 1 | 1 |
| | | pH | | 4.0 | 6.0 | 2.1 | 2.1 | 2.1 |
| Polishing evaluation | Polishing rate | Silicon nitride film (Å/min) | | 500 | 480 | 620 | 580 | 560 |
| | | Silicon oxide film (Å/min) | | 32 | 20 | 30 | 50 | 110 |
| | | Amorphous silicon film (Å/min) | | 30 | 25 | 28 | 32 | 105 |
| | | Polysilicon film (Å/min) | | 89 | 70 | 73 | 78 | 110 |

TABLE 1-continued

| | | | | | | |
|---|---|---|---|---|---|---|
| Polishing rate ratio | Silicon nitride film/silicon oxide film | 15.6 | 24.0 | 20.7 | 11.6 | 5.1 |
| | Silicon nitride film/amorphous silicon film | 16.7 | 19.2 | 22.1 | 18.1 | 5.3 |
| | Silicon nitride film/polysilicon film | 5.6 | 6.9 | 8.5 | 7.4 | 5.1 |

TABLE 2

| | | | | Example 12 | Example 13 | Example 14 | Example 15 | Example 16 | Example 17 |
|---|---|---|---|---|---|---|---|---|---|
| Composition for chemical mechanical polishing | Abrasive grain | Silica particle | Type | Silica particle A | Silica particle A | Silica particle A | Silica particle A | Silica particle A | Silica particle A |
| | | | Addition amount (number of parts) | 100 | 100 | 100 | 100 | 100 | 100 |
| | | Mercapto group-containing silane coupling agent | Addition amount (number of parts) | 0.12 | 0.12 | 0.12 | 0.12 | 0.12 | 0.12 |
| | | Compound having carbon-carbon unsaturated double bond | Type | PKA-5003 | PKA-5005 | PKA-5008 | PKA-5010 | PKA-5011 | PKA-5012 |
| | | | Addition amount (number of parts) | 0.072 | 0.24 | 0.072 | 0.32 | 0.12 | 0.32 |
| | | Radical-generating agent | Type | VA-057 | VA-057 | VA-057 | VA-057 | VA-057 | VA-057 |
| | | | Addition amount (number of parts) | 0.07 | 0.07 | 0.07 | 0.07 | 0.07 | 0.07 |
| | | Hydrogen peroxide (35% by mass aqueous solution) (number of parts) | | 0.54 | 0.54 | 0.54 | 0.54 | 0.54 | 0.54 |
| | | Zeta-potential (mV) | | −24 | −26 | −26 | −23 | −28 | −22 |
| | | Average secondary particle size (nm) | | 58 | 61 | 59 | 90 | 60 | 85 |
| | | Mercapto group-containing silane coupling agent/compound having carbon-carbon unsaturated double bond (molar ratio) | | 4 | 4 | 4 | 4 | 4 | 4 |
| | | Compound having carbon-carbon unsaturated double bond/radical-generating agent (molar ratio) | | 1 | 1 | 1 | 1 | 1 | 1 |
| | | pH | | 2.1 | 2.1 | 2.1 | 2.1 | 2.1 | 2.1 |
| Polishing evaluation | Polishing rate | Silicon nitride film (Å/min) | | 520 | 560 | 530 | 520 | 580 | 530 |
| | | Silicon oxide film (Å/min) | | 98 | 60 | 90 | 100 | 53 | 43 |
| | | Amorphous silicon film (Å/min) | | 68 | 45 | 85 | 70 | 43 | 38 |
| | | Polysilicon film (Å/min) | | 100 | 99 | 100 | 102 | 98 | 92 |
| | Polishing rate ratio | Silicon nitride film/silicon oxide film | | 5.3 | 9.3 | 5.9 | 5.2 | 10.9 | 12.3 |
| | | Silicon nitride film/amorphous silicon film | | 7.6 | 12.4 | 6.2 | 7.4 | 13.5 | 13.9 |
| | | Silicon nitride film/polysilicon film | | 5.2 | 5.7 | 5.3 | 5.1 | 5.9 | 5.8 |

TABLE 2-continued

| | | | | Example 18 | Comparative Example 1 | Comparative Example 2 | Comparative Example 3 | Comparative Example 4 |
|---|---|---|---|---|---|---|---|---|
| Composition for chemical mechanical polishing | Abrasive grain | Silica particle | Type | Silica particle A | Silica particle A | Silica particle A | Silica particle A | Silica particle A |
| | | | Addition amount (number of parts) | 100 | 100 | 100 | 100 | 100 |
| | | Mercapto group-containing silane coupling agent | Addition amount (number of parts) | 0.12 | — | 0.12 | 0.12 | 0.12 |
| | | Compound having carbon-carbon unsaturated double bond | Type | PKA-5014TF | — | — | — | PKA-5013 |
| | | | Addition amount (number of parts) | 0.24 | — | — | — | 0.32 |
| | | Radical-generating agent | Type | VA-057 | — | — | — | VA-057 |
| | | | Addition amount (number of parts) | 0.07 | — | — | — | 0.07 |
| | | Hydrogen peroxide (35% by mass aqueous solution) (number of parts) | | 0.54 | — | — | 0.54 | — |
| | | Zeta-potential (mV) | | −25 | 1 | 2 | −38 | −1 |
| | | Average secondary particle size (nm) | | 62 | 60 | 58 | 59 | >1000 |
| | | Mercapto group-containing silane coupling agent/ compound having carbon-carbon unsaturated double bond (molar ratio) | | 4 | — | — | — | 4 |
| | | Compound having carbon-carbon unsaturated double bond/radical-generating agent (molar ratio) | | 1 | — | — | — | 1 |
| | | pH | | 2.1 | 2.1 | 2.1 | 2.1 | 2.1 |
| Polishing evaluation | Polishing rate | Silicon nitride film (Å/min) | | 560 | 497 | 496 | 640 | — |
| | | Silicon oxide film (Å/min) | | 95 | 502 | 368 | 200 | — |
| | | Amorphous silicon film (Å/min) | | 91 | 309 | 353 | 210 | — |
| | | Polysilicon film (Å/min) | | 110 | 259 | 263 | 195 | — |
| | Polishing rate ratio | Silicon nitride film/silicon oxide film | | 5.9 | 1.0 | 1.3 | 3.2 | — |
| | | Silicon nitride film/amorphous silicon film | | 6.2 | 1.6 | 1.4 | 3.0 | — |
| | | Silicon nitride film/ polysilicon film | | 5.1 | 1.9 | 1.9 | 3.3 | — |

The following commercially available products were used for the reagents in Table 1 above and Table 2 above.

<Mercapto Group-Containing Silane Coupling Agent>

Manufactured by FUJIFILM Wako Pure Chemical Corporation, (3-mercaptopropyl)trimethoxysilane <Compound Having Carbon-Carbon Unsaturated Double Bond>

PKA-5001: manufactured by NOF CORPORATION, product name "UNIOX PKA-5001", average molecular weight 200, allylated polyether, EO chain, terminal OH PKA-5003: manufactured by NOF CORPORATION, product name "UNIOX PKA-5003", average molecular weight 450, allylated polyether, EO chain, terminal OH PKA-5005: manufactured by NOF CORPORATION, product name "UNIOX PKA-5005", average molecular weight 1500, allylated polyether, EO chain, terminal OH PKA-5008: manufactured by NOF CORPORATION, product name "UNIOX PKA-5008", average molecular weight 450, allylated polyether, EO chain, terminal $CH_3$ PKA-5010: manufactured by NOF CORPORATION, product name "UNIOX PKA-5010", average molecular weight 2000, allylated polyether, EO chain, terminal $CH_3$ PKA-5011: manufactured by NOF CORPORATION, product name "UNIOX PKA-5011", average molecular weight 7500, allylated polyether, EO/PO chain, terminal OH PKA-5012: manufactured by NOF CORPORATION, product name "UNIOX PKA-5012", average molecular weight 2000, allylated polyether, EO/PO chain, terminal OH PKA-5013: manufactured by NOF CORPORATION, product name "UNIOX PKA-5013", average molecular weight 2000, allylated polyether, EO/PO chain, terminal OH PKA-5014TF: manufactured by NOF CORPORATION, product name "UNIOX PKA-5014TF", average molecular weight 1500, allylated polyether, PO chain, terminal OH <Radical-Generating Agent>

VA-057: manufactured by FUJIFILM Wako Pure Chemical Corporation, 2,2'-azobis[N-(2-carboxyethyl)-2-methylpropionamidine]tetrahydrate, water-soluble azo polymerization initiator <Peroxide>

Hydrogen peroxide (35% by mass aqueous solution), manufactured by FUJIFILM Wako Pure Chemical Corporation In Examples 1 to 18, it was found that by using abrasive grains having a polymer chain grafted onto the surface by a covalent bond via —SO$_x$— (x=0 to 2), a silicon nitride film could be selectively polished with respect to silicon oxide films, amorphous silicon films, and polysilicon films, and favorable polishing characteristics could be achieved.

In Comparative Examples 1 to 3, it was found that since the abrasive grains having a polymer chain grafted onto the surface were not used, a silicon nitride film could not be selectively polished, and favorable polishing characteristics could not be achieved. In Comparative Example 4, since agglomeration occurred, the composition for chemical mechanical polishing could not be produced by filtration through a filter having the pore diameter of 0.3 μm, and therefore the polishing rate could not be evaluated.

From the above results, it was found that according to the composition for chemical mechanical polishing of the invention of the present application, a silicon nitride film could be selectively polished at a high speed with respect to silicon oxide films, amorphous silicon films, and polysilicon films, and favorable polishing characteristics could be achieved.

The present invention is not limited to the embodiments described above, and various modifications can be made. For example, the present invention includes a configuration substantially the same as the configuration described in the embodiments (for example, a configuration having the same function, method, and results, or a configuration having the same objective and effect). The present invention further includes a configuration in which a non-essential part of the configuration described in the embodiments is replaced. The present invention still further includes a configuration that exhibits the same function effect as the configuration described in the embodiments or a configuration that can achieve the same objective. The present invention still further includes a configuration in which a known technique is added to the configuration described in the embodiments.

REFERENCE SIGNS LIST

10 Silicon wafer
12 Thermal oxide film
14 Silicon nitride film
16 Groove
18 Silicon oxide film
42 Slurry supply nozzle
44 Composition for chemical mechanical polishing (slurry)
46 Polishing cloth
48 Turntable
50 Semiconductor substrate
52 Carrier head
54 Water supply nozzle
56 Dresser
100 Object to be processed
200 Chemical mechanical polishing apparatus

The invention claimed is:

1. A method for manufacturing abrasive grains, the method comprising:
a first step of heating a mixture which contains particles having a sulfanyl group (—SH) fixed to a surface thereof via a covalent bond, and which contains a compound having a carbon-carbon unsaturated double bond; and
a second step of further adding a peroxide and carrying out heating after the first step,
wherein a polymer chain is grafted onto a surface of the abrasive grains by a covalent bond via —SO$_x$—, where x is an integer of 0 to 2.

2. The method for manufacturing abrasive grains according to claim 1, wherein the mixture in the first step further contains a radical-generating agent.

3. The method for manufacturing abrasive grains according to claim 1, wherein an average molecular weight of the compound having a carbon-carbon unsaturated double bond is 100 to 10,000.

4. The method for manufacturing abrasive grains according to claim 1, wherein the abrasive grains have a functional group represented by General Formula (1) on a surface thereof, $$—SO_3^-M^+ \tag{1}$$

(where M$^+$ represents a monovalent cation).

5. The method for manufacturing abrasive grains according to claim 1, wherein a zeta-potential of the abrasive grains is less than −10 mV in a composition for chemical mechanical polishing containing the abrasive grains.

* * * * *